US009960335B2

(12) United States Patent
Yoshida et al.

(10) Patent No.: US 9,960,335 B2
(45) Date of Patent: May 1, 2018

(54) THERMOELECTRIC ELEMENT, THERMOELECTRIC MODULE AND METHOD OF MANUFACTURING THERMOELECTRIC ELEMENT

(71) Applicants: Yasutaka Yoshida, Chichibu (JP); Kenichiro Nakajima, Chichibu (JP)

(72) Inventors: Yasutaka Yoshida, Chichibu (JP); Kenichiro Nakajima, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 204 days.

(21) Appl. No.: 14/608,743

(22) Filed: Jan. 29, 2015

(65) Prior Publication Data

US 2015/0228880 A1    Aug. 13, 2015

(30) Foreign Application Priority Data

Feb. 10, 2014   (JP) .................... 2014-023819

(51) Int. Cl.
| | |
|---|---|
| *H01L 35/18* | (2006.01) |
| *B22F 3/105* | (2006.01) |
| *B22F 5/00* | (2006.01) |
| *B22F 7/02* | (2006.01) |
| *H01L 35/34* | (2006.01) |

(Continued)

(52) U.S. Cl.
CPC .............. *H01L 35/18* (2013.01); *B22F 3/105* (2013.01); *B22F 3/14* (2013.01); *B22F 5/00* (2013.01); *B22F 7/02* (2013.01); *C22C 1/0458* (2013.01); *C22C 33/0278* (2013.01); *H01L 35/34* (2013.01); *B22F 2003/1051* (2013.01); *B22F 2999/00* (2013.01)

(58) Field of Classification Search
None
See application file for complete search history.

(56) References Cited

U.S. PATENT DOCUMENTS

| | | | |
|---|---|---|---|
| 6,043,423 A | 3/2000 | Satomura et al. | |
| 6,121,125 A * | 9/2000 | Lee ................... | H01L 21/28061 257/E21.2 |

(Continued)

FOREIGN PATENT DOCUMENTS

| | | |
|---|---|---|
| CN | 1969354 A | 5/2007 |
| JP | 10-74986 A | 3/1998 |

(Continued)

OTHER PUBLICATIONS

Ono et al. "Magnetic properties of Fe/Ti multilayered films for a magnetic recording medium" in IEEE Transactions on Magnetics, vol. 25, No. 5, Sep. 1989, pp. 3872-3874.*

(Continued)

*Primary Examiner* — Magali P Slawski
(74) *Attorney, Agent, or Firm* — Sughrue Mion, PLLC (57) ABSTRACT

Cracking in a thermoelectric element made of a filled-skutterudite-type alloy is suppressed. A p-type thermoelectric element includes: a p-type thermoelectric conversion layer made of an alloy having a filled-skutterudite structure containing antimony; a p-side first metal layer that contains titanium simple substances and iron simple substances, and is laminated on the p-type thermoelectric conversion layer; and a p-side second metal layer that contains titanium simple substances, and is laminated on the p-side first metal layer.

19 Claims, 6 Drawing Sheets

(51) Int. Cl.
*B22F 3/14* (2006.01)
*C22C 1/04* (2006.01)
*C22C 33/02* (2006.01)

(56) References Cited

U.S. PATENT DOCUMENTS

| | | | |
|---|---|---|---|
| 2003/0159922 A1* | 8/2003 | Miley | G21B 3/00 |
| | | | 204/290.03 |
| 2007/0034245 A1* | 2/2007 | Nakajima | C22C 12/00 |
| | | | 136/205 |
| 2008/0092940 A1 | 4/2008 | Nakajima | |
| 2008/0203514 A1* | 8/2008 | Szeles | H01L 27/14658 |
| | | | 257/442 |
| 2010/0294326 A1* | 11/2010 | Guo | B22F 3/14 |
| | | | 136/238 |
| 2011/0036099 A1 | 2/2011 | Bari | |
| 2011/0048590 A1 | 3/2011 | Nakajima | |
| 2011/0241153 A1* | 10/2011 | McCann | H01L 35/08 |
| | | | 257/467 |
| 2011/0265919 A1 | 11/2011 | Nakajima | |
| 2013/0037071 A1 | 2/2013 | Gerster et al. | |
| 2014/0216515 A1 | 8/2014 | Ochi et al. | |
| 2014/0345666 A1 | 11/2014 | Konnai et al. | |
| 2015/0155463 A1 | 6/2015 | Gerster et al. | |

FOREIGN PATENT DOCUMENTS

| | | |
|---|---|---|
| JP | 2002-212607 A | 7/2002 |
| JP | 2003-92435 A | 3/2003 |
| JP | 2003-309294 A | 10/2003 |
| JP | 2004-192992 A | 7/2004 |
| JP | 2005-19910 A | 1/2005 |
| JP | 2006-49736 A | 2/2006 |
| JP | 2006-89847 A | 4/2006 |
| JP | 2006-131950 A | 5/2006 |
| JP | 2006-319210 A | 11/2006 |
| JP | 2011-3559 A | 1/2011 |
| JP | 2011-510479 A | 3/2011 |
| JP | 2011-114186 A | 6/2011 |
| JP | 2011-249442 A | 12/2011 |
| JP | 2013-32244 A | 2/2013 |
| JP | 2013-38172 A | 2/2013 |
| JP | 2013-48234 A | 3/2013 |
| JP | 2013-165113 A | 8/2013 |
| WO | 2009/093455 A1 | 7/2009 |
| WO | 2013/076765 A1 | 5/2013 |
| WO | 2013/108518 A1 | 7/2013 |

OTHER PUBLICATIONS

Gasior et al; "Enthalpy of formation of intermetallic phases from Fe—Ni—Ti system. Comparative studies"; Archives of Metallurgy and Materials 57(4): pp. 1095-1104; Dec. 2012.

Boa et al; "The iron-antimony system: enthalpies of formation of the $FeSb_2$ and $\epsilon$-FeSb phases"; Journal of Alloys and Compounds; vol. 365 (2004); pp. 228-232.

* cited by examiner

THERMOELECTRIC ELEMENT, THERMOELECTRIC MODULE AND METHOD OF MANUFACTURING THERMOELECTRIC ELEMENT

CROSS REFERENCE TO RELATED APPLICATION

This application is based on and claims priority under 35 USC § 119 from Japanese Patent Application No. 2014-023819 filed Feb. 10, 2014, incorporated herein by reference in its entirety.

BACKGROUND

Technical Field

The present invention relates to a thermoelectric element, a thermoelectric module and a method of manufacturing the thermoelectric element.

Related Art

A thermoelectric element including a thermoelectric conversion layer made of a filled-skutterudite-type alloy and a thermoelectric module using such a thermoelectric element are known.

As a conventional art, in a thermoelectric element including a thermoelectric conversion layer made of a filled-skutterudite-type alloy, there is a technique in which titanium layers are provided on both end surfaces of the thermoelectric element for suppressing diffusion of elements at a joint portion between the thermoelectric element and an electrode (refer to Japanese Patent Application Laid-Open Publication No. 2003-309294).

By the way, a coefficient of linear expansion of titanium has a tendency to be largely different from a coefficient of linear expansion of a filled-skutterudite-type alloy. For this reason, in a thermoelectric element in which a thermoelectric conversion layer made of a filled-skutterudite-type alloy and a diffusion suppressing layer made of titanium are directly laminated, there are some cases in which cracking or peeling occurs due to a difference between amounts of coefficient of linear expansion of respective layers.

An object of the present invention is to suppress cracking in a thermoelectric element including a thermoelectric conversion layer made of a filled-skutterudite-type alloy.

SUMMARY

According to an aspect of the present invention, there is provided a thermoelectric element including: a thermoelectric conversion layer made of an alloy having a filled-skutterudite structure containing antimony; a first metal layer that contains titanium simple substances and iron simple substances, and is laminated on the thermoelectric conversion layer; and a second metal layer that contains titanium simple substances, and is laminated on the first metal layer.

Here, the first metal layer contains the iron simple substances in a large amount as compared to the titanium simple substances.

Moreover, a content ratio between titanium and iron is in a range from 10:90 to 40:60, where the content ratio is a weight ratio.

Further, the thermoelectric conversion layer is made of an alloy having a filled-skutterudite structure represented as $RE_x(Fe_{1-y}M_y)_4Sb_{12}$, where RE is at least one kind selected from rare earth elements, M is at least one kind selected from a group constituted by Co and Ni, $0.01 \leq x \leq 1$, and $0 \leq y \leq 0.3$.

Still further, a coefficient of linear expansion of the first metal layer is a value existing between a coefficient of linear expansion of the thermoelectric conversion layer and a coefficient of linear expansion of the second metal layer.

Moreover, if the present invention is captured as a thermoelectric module, there is provided a thermoelectric module including: a thermoelectric element; and an electrode electrically connected thereto, wherein the thermoelectric element includes: a thermoelectric conversion layer made of an alloy having a filled-skutterudite structure containing antimony; a first metal layer that contains titanium simple substances and iron simple substances, and is laminated on the thermoelectric conversion layer between the electrode and the thermoelectric conversion layer; and a second metal layer that contains titanium simple substances, and is laminated between the first metal layer and the electrode.

Further, if the present invention is captured as a method of manufacturing a thermoelectric element, there is provided a method of manufacturing a thermoelectric element, including: laminating titanium powder, mixed powder containing titanium powder and iron powder, alloy powder containing antimony, iron and a rare earth element, the mixed powder containing titanium powder and iron powder, and the titanium powder in order in a die; and performing plasma sintering on the powders laminated in the die while applying pressure in a direction of laminating the powders.

Here, a particle diameter of the titanium powder is in a range of not less than 10 μm and not more than 50 μm.

Moreover, the mixed powder contains the iron powder in a large amount as compared to the titanium powder.

According to the present invention, it is possible to suppress cracking in a thermoelectric element including a thermoelectric conversion layer made of a filled-skutterudite-type alloy.

BRIEF DESCRIPTION OF THE DRAWINGS

An exemplary embodiment of the present invention will be described in detail based on the following figures, wherein.

DETAILED DESCRIPTION

Hereinafter, an exemplary embodiment according to the present invention will be described with reference to attached drawings.

(Thermoelectric Module)

Figure 1:
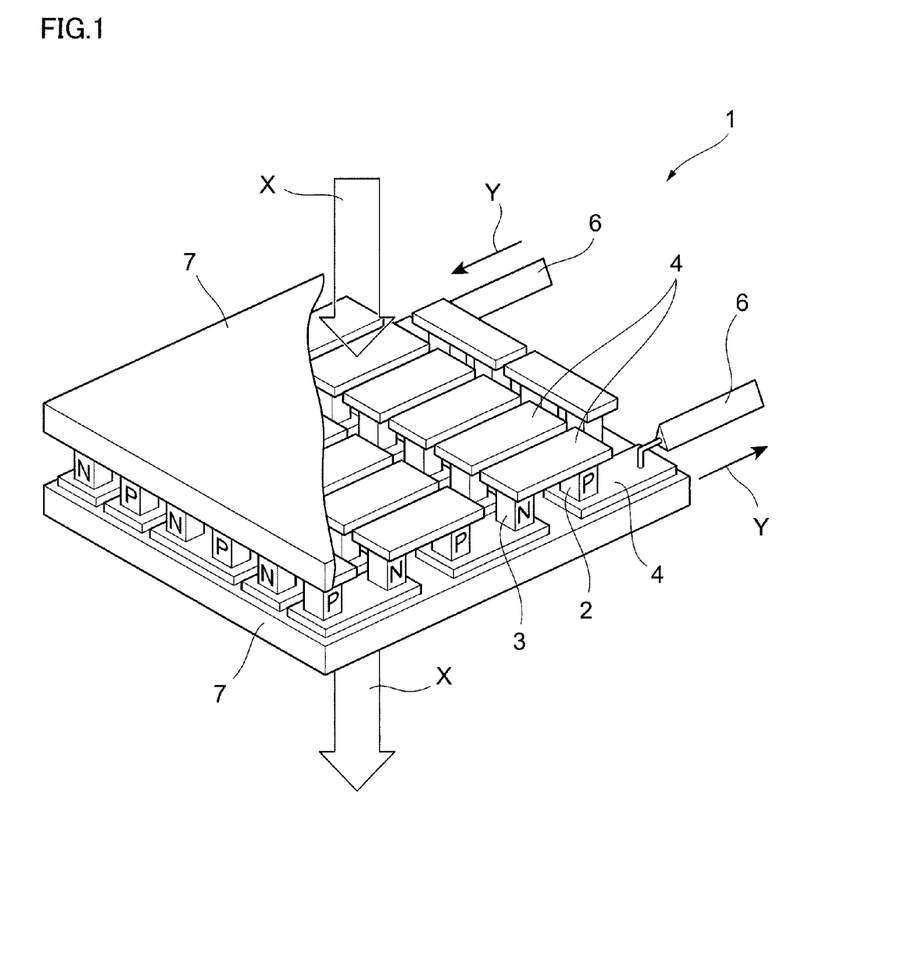
FIG. 1 is a schematic view showing a specific example of a thermoelectric module to which the exemplary embodiment is applied.

FIG. 1 is a schematic view showing a specific example of a thermoelectric module to which the exemplary embodiment is applied.

In a thermoelectric module 1 of the exemplary embodiment, as shown in FIG. 1, between two insulating substrates 7 vertically facing each other, plural p-type thermoelectric elements 2 and plural n-type thermoelectric elements 3 are arranged. The plural p-type thermoelectric elements 2 and the plural n-type thermoelectric elements 3 are serially connected alternately by plural electrodes 4, and are attached to each substrate 7 via the electrodes 4. In addition, of the serially connected plural p-type thermoelectric elements 2 and plural n-type thermoelectric elements 3, to the p-type thermoelectric element 2 positioned at one end and the n-type thermoelectric element 3 positioned at the other end, lead wires 6 are connected via the electrodes 4.

It should be noted that, though the shape of each p-type thermoelectric element 2 and each n-type thermoelectric element 3 is not particularly limited, usually, the shape is a prism or a circular cylinder. In the thermoelectric module 1 shown in FIG. 1, each of the p-type thermoelectric elements 2 and the n-type thermoelectric elements 3 has a prism shape. Moreover, side surfaces of each of the p-type thermoelectric elements 2 and the n-type thermoelectric elements 3 (surfaces that are not connected to the electrodes 4) may be coated with coating layers composed of, for example, titanium nitride.

In addition, though illustration is omitted, in the thermoelectric module 1, a high-temperature-side heat exchanger is arranged adjacent to one of the substrates 7 (in this specific example, the upper side substrate 7), and a low-temperature-side heat exchanger is arranged adjacent to the other substrate 7 (in this specific example, the lower side substrate 7).

In the thermoelectric module 1 of the exemplary embodiment, as indicated by arrows X, a great temperature difference is generated between the high-temperature side and the low-temperature side of each thermoelectric element (the p-type thermoelectric element 2 and the n-type thermoelectric element 3) by adding heat by the high-temperature-side heat exchanger and removing heat by the low-temperature-side heat exchanger, to thereby generate an electromotive force. Then, by imposing an electric resistance load between the two lead wires 6, current flows as indicated by arrows Y.

It should be noted that, in the following description, there are some cases in which, in the thermoelectric module 1, the side where the high-temperature side heat exchanger is provided is simply referred to as a high-temperature side, and the side where the low-temperature-side heat exchanger is provided is simply referred to as a low-temperature side.

(Electrode)

The electrode 4 of the exemplary embodiment is composed of a metal having high mechanical strength at high temperature, such as copper or iron.

Further, in the thermoelectric module 1 of the exemplary embodiment, another layer for improving joining properties between the p-type thermoelectric element 2 or n-type thermoelectric element 3 and the electrode 4 may be provided between the p-type thermoelectric element 2 or n-type thermoelectric element 3 and the electrode 4.

(P-Type Thermoelectric Element)

Figure 2A:
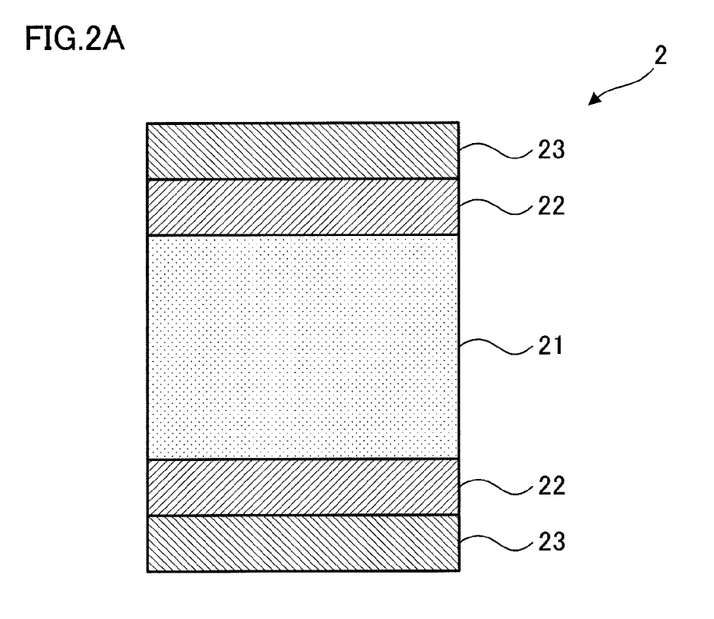
FIGS. 2A and 2B are cross-sectional schematic views showing specific examples of a p-type thermoelectric element to which the exemplary embodiment is applied.

Subsequently, the p-type thermoelectric element 2, to which the exemplary embodiment is applied, will be described. FIG. 2A is a cross-sectional schematic view showing a specific example of the p-type thermoelectric element 2 to which the exemplary embodiment is applied, and FIG. 2B is a cross-sectional schematic view showing another specific example of the p-type thermoelectric element 2 to which the exemplary embodiment is applied.

As shown in FIG. 2A, the p-type thermoelectric element 2 of the exemplary embodiment includes: a p-type thermoelectric conversion layer 21 as a specific example of a thermoelectric conversion layer that generates an electromotive force by a temperature difference between the high-temperature side and the low-temperature side; p-side first metal layers 22 as a specific example of first metal layers laminated on two facing surfaces of the p-type thermoelectric conversion layer 21; and p-side second metal layers 23 as a specific example of second metal layers laminated on the respective p-side first metal layers 22. In the p-type thermoelectric element 2 of the exemplary embodiment, the above-described electrodes 4 (refer to FIG. 1) are connected onto the p-side second metal layers 23.

Figure 2B:
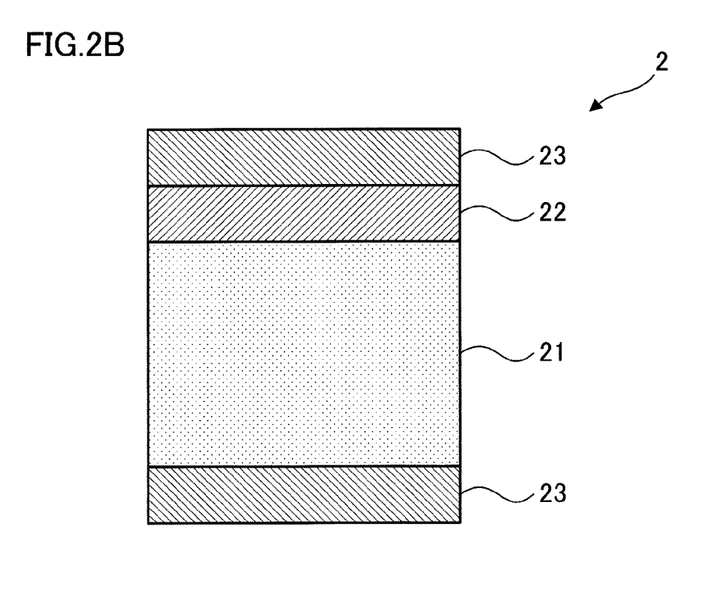

It should be noted that, as shown in FIG. 2B, the p-side first metal layer 22 may be provided only on one of the two facing surfaces of the p-type thermoelectric conversion layer 21. In this case, on the surface on which the p-side first metal layer 22 is not provided, the p-side second metal layer 23 is directly laminated on the p-type thermoelectric conversion layer 21. In the case where the p-side first metal layer 22 is provided only on one surface of the p-side thermoelectric conversion layer 21, as the specific example shown in FIG. 2B, the p-type thermoelectric element 2 is arranged so that the side where the p-side first metal layer 22 is provided is located as the high-temperature side and the side where the p-side first metal layer is not provided is located as the low-temperature side.

(P-Type Thermoelectric Conversion Layer)

For the p-type thermoelectric conversion layer 21 of the exemplary embodiment, it is possible to adopt semiconductor made of a filled-skutterudite-type alloy containing antimony represented as, for example, $RE_x(Fe_{1-y}M_y)_4Sb_{12}$ (RE is at least one kind selected from rare earth elements, M is at least one kind selected from a group constituted by Co and Ni, $0.01 \leq x \leq 1$, $0 \leq y \leq 0.3$).

Here, as RE, it is preferable to use at least one kind of Nd, Pr and Yb.

Turning to a specific description, in the filled-skutterudite-type alloy containing antimony (Sb) constituting the p-type thermoelectric conversion layer 21 of the exemplary embodiment, a crystal structure in which Sb is arranged at each of vertex positions of an octahedron and Fe and M are surrounded by Sb is employed (skutterudite structure). Then, RE enters into a gap formed among Fe, M and Sb that constitute the skutterudite structure, to thereby form a structure. In the p-type thermoelectric conversion layer 21 of the exemplary embodiment, usually, thermoelectric conversion is generated by Fe, M and Sb constituting the skutterudite structure.

It should be noted that the p-type thermoelectric conversion layer 21 may contain unavoidable impurities contained in raw materials. It is possible to check the crystal structure of the p-type thermoelectric conversion layer 21 by, for example, X-ray diffraction or the like.

In a case where the above-described alloy having the filled skutterudite structure is used for the p-type thermoelectric conversion layer 21, x is preferably in a range of not less than 0.01 and not more than 1, and y is preferably in a range of not less than 0 and not more than 0.3.

If x is less than 0.01, since thermal conductivity of the p-type thermoelectric conversion layer 21 is increased, to thereby result in small temperature difference between the high-temperature side and the low-temperature side of the p-type thermoelectric conversion layer 21, there is a possibility that thermoelectric conversion efficiency is degraded. Moreover, if x exceeds 1, rare earth elements that do not fit in a crystal lattice are deposited to cause a possibility that electrical properties of the p-type thermoelectric conversion layer 21 are degraded.

In addition, if y exceeds 0.3, there is a possibility that a Seebeck coefficient of the p-type thermoelectric conversion layer 21 is reduced.

(P-Side First Metal Layer)

The p-side first metal layer 22 of the exemplary embodiment is configured with a mixing layer of iron and titanium, and contains iron simple substances (pure metal) and titanium simple substances (pure metal). Turning to a specific description, the p-side first metal layer 22 includes portions in which lumps of iron simple substances exist and portions in which lumps of titanium simple substances exist, and these portions are mixed in spots.

It should be noted that, in the p-side first metal layer 22, for example, an alloy of iron and titanium may be contained in a boundary portion between the iron simple substances and the titanium simple substances or the like. Moreover, the p-side first metal layer 22 may contain impurities such as a metal other than iron and titanium.

The p-side first metal layer 22 of the exemplary embodiment is formed by, for example, sintering iron powder and titanium powder. It should be noted that a method of making the p-side first metal layer 22 or the like will be described later.

In the p-type thermoelectric element 2 of the exemplary embodiment, since the p-side first metal layer 22 is provided, it becomes possible to suppress diffusion of antimony from the p-type thermoelectric conversion layer 21 and to reduce a stress generated between the p-type thermoelectric conversion layer 21 and the p-side second metal layer 23.

Accordingly, performance degradation and cracking of the p-type thermoelectric element 2 or the thermoelectric module 1 are suppressed.

In other words, in the p-side first metal layer 22 of the exemplary embodiment, due to existence of iron in the state of simple substances, if antimony is liberated from the p-type thermoelectric conversion layer 21, antimony reacts with iron to form iron antimony. As a result, antimony liberated from the p-type thermoelectric conversion layer 21 is caught in the p-side first metal layer 22, and thereby it is possible to suppress diffusion of antimony from the p-type thermoelectric conversion layer 21 to the electrode 4.

Accordingly, in the p-type thermoelectric element 2 of the exemplary embodiment, degradation in thermoelectric performance of the p-type thermoelectric conversion layer 21 and performance degradation of the electrode 4 are suppressed.

It should be noted that iron antimony is usually contained in the p-type thermoelectric conversion layer 21 as the impurities. Consequently, even in the case where iron antimony is generated in the p-side first metal layer 22, problems caused by iron antimony tend not to occur in the p-type thermoelectric element 2.

In addition, usually, iron has a crystal structure of a body-centered cubic type at a temperature of not more than about 910° C. Moreover, the filled-skutterudite-type alloy constituting the above-described p-type thermoelectric conversion layer 21 also has the crystal structure of the body-centered cubic type. In other words, the p-type thermoelectric conversion layer 21 of the exemplary embodiment has a crystal structure close to a crystal structure of iron contained in the p-side first metal layer 22.

Then, a coefficient of linear expansion of iron simple substances (about $12 \times 10^{-6}$/° C.) is close to a coefficient of linear expansion of the p-type thermoelectric conversion layer 21 made of the filled-skutterudite-type alloy. Moreover, as will be described later, the p-side second metal layer 23 of the exemplary embodiment is composed of titanium (a coefficient of linear expansion of about $8.4 \times 10^{-6}$/° C.).

As a result of this, in the exemplary embodiment, since the p-side first metal layer 22 is configured with a mixed layer of iron simple substances and titanium simple substances, the coefficient of linear expansion of the p-side first metal layer 22 is small as compared with that of the p-type thermoelectric conversion layer 21 and is large as compared with that of the p-side second metal layer 23.

Therefore, in the p-type thermoelectric element 2 of the exemplary embodiment, excellent joining properties can be obtained at an interface between the p-type thermoelectric conversion layer 21 and the p-side first metal layer 22 and an interface between the p-side first metal layer 22 and the p-side second metal layer 23.

Moreover, for example, even in a case where, the p-type thermoelectric element 2 has high temperature and thermal expansion is caused in each layer of the thermoelectric element 2 during the use of the thermoelectric module 1, it is possible to suppress occurrence of stresses at an interface of each layer and to suppress cracking or peeling of each layer.

Here, in the p-side first metal layer 22 of the exemplary embodiment, it is preferable that iron content is high as compared to titanium content. Since, by setting the iron content high as compared to the titanium content, the coefficient of linear expansion of the p-side first metal layer 22 becomes closer to the coefficient of linear expansion of the p-type thermoelectric conversion layer 21, it is possible to suppress peeling or the like at the interface between the p-type thermoelectric conversion layer 21 and the p-side first metal layer 22 even better.

Moreover, by setting the iron content high as compared to the titanium content, it becomes easier to catch antimony in the p-side first metal layer 22, and thereby, it becomes possible to suppress diffusion of antimony from the p-type thermoelectric conversion layer 21 even better.

A content ratio (weight ratio) of iron and titanium in the p-side first metal layer 22 is not particularly limited; however, the content ratio of titanium and iron is preferably in the range of 10:90 to 40:60.

The thickness of the p-side first metal layer 22 is, for example, preferably not less than 20 μm, and more preferably, not less than 100 μm. Moreover, the thickness of the p-side first metal layer 22 is, for example, preferably not more than 500 μm, and more preferably, not more than 300 μm.

In a case where the thickness of the p-side first metal layer 22 is larger than 500 μm, the thickness of the p-type thermoelectric element 2 tends to be large. Moreover, thermal conduction from the high-temperature-side heat exchanger to the p-type thermoelectric conversion layer 21 or thermal conduction from the p-type thermoelectric conversion layer 21 to the low-temperature-side heat exchanger is suppressed, and accordingly, there is a possibility that thermoelectric conversion efficiency in the p-type thermoelectric element 2 is degraded.

On the other hand, in a case where the thickness of the p-side first metal layer 22 is smaller than 20 μm, there is a possibility that effect of reducing a stress or catching antimony by the p-side first metal layer 22 becomes insufficient.

(P-Side Second Metal Layer)

The p-side second metal layer 23 of the exemplary embodiment is composed of titanium. It should be noted that, in the p-side second metal layer 23, metals other than titanium, alloys of titanium and other metals, and the like may be partially contained.

In the p-type thermoelectric element 2 of the exemplary embodiment, since the p-side second metal layer 23 is provided, it becomes possible to suppress diffusion of antimony from the p-type thermoelectric conversion layer 21 and diffusion of elements from electrodes to the p-type thermoelectric conversion layer 21 and the p-side first metal layer 22.

In the p-type thermoelectric element 2 of the exemplary embodiment, as described above, since the p-side first metal layer 22 is provided, antimony from the p-type thermoelectric conversion layer 21 reacts with iron contained in the p-side first metal layer 22, and accordingly, it is possible to catch antimony from the p-type thermoelectric conversion layer 21 in the p-side first metal layer 22.

However, for example, in a case where a large amount of antimony is diffused from the p-type thermoelectric conversion layer 21, or in a case where antimony is continuously diffused from the p-type thermoelectric conversion layer 21, it becomes difficult to catch the whole antimony in the p-side first metal layer 22 in some cases.

In contrast, in the exemplary embodiment, by providing the p-side second metal layer 23 that contains titanium, it becomes possible to intercept antimony, which was liberated from the p-type thermoelectric conversion layer 21 and was not caught in the p-side first metal layer 22, by the p-side second metal layer 23. Consequently, in the p-type thermoelectric element 2, it is possible to suppress diffusion of antimony from the p-type thermoelectric conversion layer 21 to the electrode 4. Moreover, in the thermoelectric module 1 of the exemplary embodiment, by providing the p-side second metal layer 23, it is possible to suppress diffusion of elements from the electrode 4 to the p-type thermoelectric element 2.

As a result of this, it is possible to suppress degradation of thermoelectric conversion efficiency in the p-type thermoelectric conversion layer 21 of the p-type thermoelectric element 2 and performance degradation of the electrode 4.

It should be noted that, in the p-type thermoelectric element 2 of the exemplary embodiment, by reaction of antimony liberated from the p-type thermoelectric conversion layer 21 with titanium in the p-side second metal layer 23, a reaction layer made of an alloy of titanium and antimony is formed on the p-side second metal layer 23, which is on a side that is in contact with the electrode 4, in some cases.

The reaction layer also suppresses diffusion of antimony from the p-type thermoelectric conversion layer 21.

The thickness of the p-side second metal layer 23 is, for example, preferably not less than 20 μm, and more preferably, not less than 50 μm. Moreover, the thickness of the p-side second metal layer 23 is, for example, preferably not more than 500 μm, and more preferably, not more than 300 μm.

In a case where the thickness of the p-side second metal layer 23 is larger than 500 μm, the p-type thermoelectric element 2 becomes thick, and the thermoelectric module 1 tends to be large.

Moreover, in a case where the thickness of the p-side second metal layer 23 is smaller than 20 μm, there is a possibility that the effect of suppressing diffusion of elements between the p-type thermoelectric element 2 and the electrode 4 becomes insufficient.

(N-Type Thermoelectric Element)

Figure 3A:
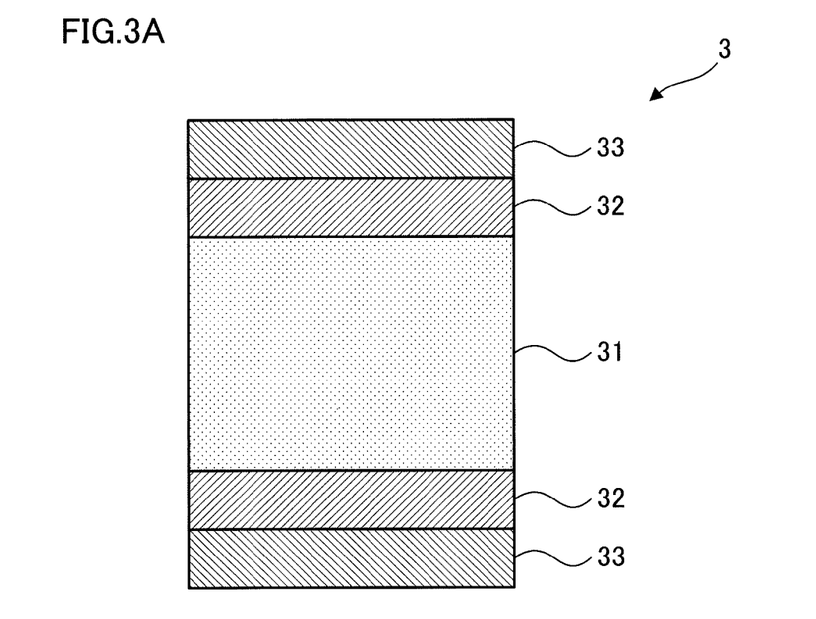
FIGS. 3A and 3B are cross-sectional schematic views showing specific examples of an n-type thermoelectric element to which the exemplary embodiment is applied.

Subsequently, the n-type thermoelectric element 3, to which the exemplary embodiment is applied, will be described. FIG. 3A is a cross-sectional schematic view showing a specific example of the n-type thermoelectric element 3 to which the exemplary embodiment is applied, and FIG. 3B is a cross-sectional schematic view showing another specific example of the n-type thermoelectric element 3 to which the exemplary embodiment is applied.

As shown in FIG. 3A, the n-type thermoelectric element 3 of the exemplary embodiment includes: an n-type thermoelectric conversion layer 31 that generates an electromotive force by a temperature difference between the high-temperature side and the low-temperature side; n-side first metal layers 32 that are laminated on the n-type thermoelectric conversion layer 31 and facing each other with the n-type thermoelectric conversion layer 31 interposed therebetween; and n-side second metal layers 33 laminated on the respective n-side first metal layers 32. In the n-type thermoelectric element 3 of the exemplary embodiment, the above-described electrodes 4 (refer to FIG. 1) are connected onto the n-side second metal layers 33.

Figure 3B:
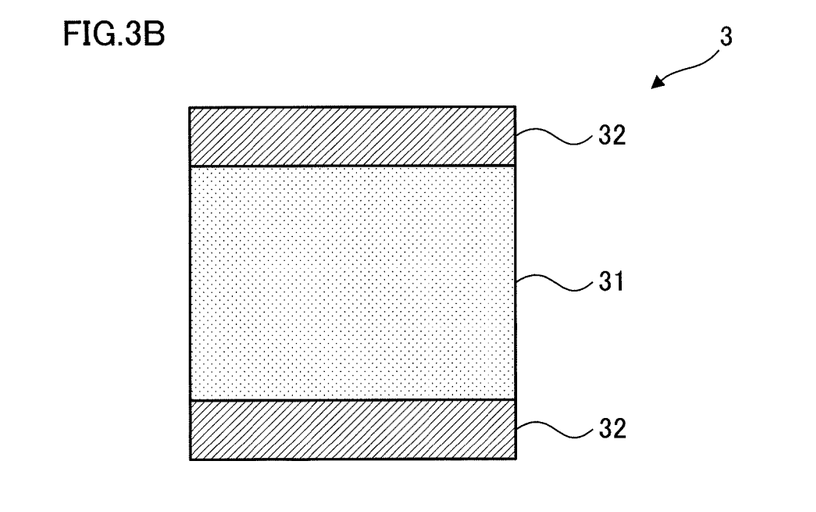

It should be noted that, as shown in FIG. 3B, in the n-type thermoelectric element 3 of the exemplary embodiment, only the n-side first metal layer 32 may be provided on the n-type thermoelectric conversion layer 31, without providing the n-side second metal layer 33.

This is because, in the n-type thermoelectric element 3 of the exemplary embodiment, as compared to the above-described p-type thermoelectric element 2, since a thermal expansion coefficient of the n-type thermoelectric conversion layer 31 is small, cracking or the like tends not to occur even in the case where the n-side second metal layer 33 is not provided. Further, in comparison with the p-type thermoelectric conversion layer 21 in the above-described p-type thermoelectric element 2, since antimony is hardly liberated from the n-type thermoelectric conversion layer 31, it is possible to suppress diffusion of antimony only by the n-side first metal layer 32.

(N-Type Thermoelectric Conversion Layer)

For the n-type thermoelectric conversion layer 31 of the exemplary embodiment, it is possible to adopt semiconductor made of a filled-skutterudite-type alloy represented as, for example, $RE_x(Co_{1-y}M_y)_4Sb_{12}$ (RE is at least one kind selected from rare earth elements, M is at least one kind selected from a group constituted by Fe and Ni, $0.01 \leq x \leq 1$, $0 \leq y \leq 0.3$). This alloy may contain unavoidable impurities contained in raw materials.

Here, as RE, it is preferable to use at least one kind of Nd, Pr and Yb.

In a case where the above-described filled-skutterudite-type alloy is used for the n-type thermoelectric conversion layer 31, x is preferably in a range of not less than 0.01 and not more than 1, and y is preferably in a range of not less than 0 and not more than 0.3.

If x is less than 0.01, since thermal conductivity is increased, there is a possibility that properties of the n-type thermoelectric element 3 are degraded. In addition, if x exceeds 1, there is a possibility that electrical properties of the n-type thermoelectric conversion layer 31 are degraded.

Further, if y exceeds 0.3, there is a possibility that a Seebeck coefficient is reduced.

(N-Side First Metal Layer)

The n-side first metal layer 32 is constituted by, for example, a mixed layer of titanium and cobalt or a mixed layer of titanium and aluminum.

With the above-described configuration, the n-side first metal layer 32 has a coefficient of linear expansion, which is small as compared to that of the n-type thermoelectric conversion layer 31 and is large as compared to that of the n-side second metal layer 33. Consequently, in a case where the n-type thermoelectric conversion layer 31 is deformed by thermal expansion, it becomes possible to reduce a stress between the n-type thermoelectric conversion layer 31 and the n-side second metal layer 33.

It should be noted that the thickness of the n-side first metal layer 32 can be, for example, in a range of not less than 20 μm and not more than 200 μm.

(N-Side Second Metal Layer)

The n-side second metal layer 33 is provided for suppressing diffusion of antimony from the n-type thermoelectric conversion layer 31, and similar to the p-side second metal layer 23, composed of titanium. It should be noted that, in the n-side second metal layer 33, metals other than titanium, alloys of titanium and other metals, and the like may be contained.

The thickness of the n-side second metal layer 33 can be, for example, in a range of not less than 20 μm and not more than 500 μm.

(Method of Manufacturing Thermoelectric Element)

Subsequently, a method of manufacturing the thermoelectric element of the exemplary embodiment will be described. Although a description will be given by taking the p-type thermoelectric element 2 shown in FIG. 2A as a specific example here, it is also possible to manufacture the p-type thermoelectric element 2 shown in FIG. 2B or the n-type thermoelectric element shown in FIG. 3A or 3B by a similar method.

The p-type thermoelectric element 2 of the exemplary embodiment is able to be manufactured by putting powdered materials constituting respective layers in order into a sintering die and carrying out plasma sintering.

Turning to a specific description, in the case where the p-type thermoelectric element 2 is to be manufactured, first, titanium powder composing the p-side second metal layer 23 is weighed and put into a sintering die made of graphite or the like. Subsequently, titanium powder and iron powder composing the p-side first metal layer 22 are weighed and mixed. Then, the mixed powder is laminated on the titanium powder put into the die, which composes the p-side second metal layer 23.

Next, alloy powder containing RE (at least one kind selected from rare earth elements), iron, M (at least one kind selected from a group constituted by Co and Ni) and antimony that constitute the p-side thermoelectric conversion layer 21 is laminated on the titanium powder composing the p-side second metal layer 23 and the mixed powder composing the p-side first metal layer 22 that have been laminated in the die.

Thereafter, the mixed powder of the titanium powder and the iron powder composing the p-side first metal layer 22 and the titanium powder composing the p-side second metal layer 23 are further put into the die in the order.

Accordingly, the powdered materials composing the p-side second metal layer 23, the p-side first metal layer 22, the p-type thermoelectric conversion layer 21, the p-side first metal layer 22 and the p-side second metal layer 23 are in the laminated state in the die in the order.

Subsequently, in a vacuum or in an inert gas, such as argon, a pulse current is applied while pressurizing these powders laminated in the die in a direction of laminating each layer, to thereby carry out sintering (discharge plasma sintering). The pressure to be applied may be set at, for example, about 1 t/cm$^2$. In addition, by application of the current, a temperature of each laminated material becomes on the order of about 600° C. to about 650° C.

Consequently, a sintered body, in which the p-side second metal layer 23, the p-side first metal layer 22, the p-type thermoelectric conversion layer 21, the p-side first metal layer 22 and the p-side second metal layer 23 are laminated in order and integrated, can be obtained.

Thereafter, by cutting the obtained sintered body into a desired size as required, the p-type thermoelectric element 2 as shown in FIG. 2A can be obtained.

Here, in the exemplary embodiment, as compared to the case where this configuration is not employed, since the p-side first metal layer 22 contains the iron powder and the titanium powder, it is possible to improve adhesive properties between the p-type thermoelectric conversion layer 21 and the p-side first metal layer 22, which are formed by sintering, and adhesive properties between the p-side first metal layer 22 and the p-side second metal layer 23, which are formed by sintering.

Accordingly, also in the manufacturing step of the p-type thermoelectric element 2, it is possible to suppress occurrence of cracking or peeling at the interface between the p-type thermoelectric conversion layer 21 and the p-side first metal layer 22, or at the interface between the p-side first metal layer 22 and the p-side second metal layer 23. As a result of this, as compared to the case where this configuration is not employed, it is possible to improve yields of the p-type thermoelectric element 2.

It is preferable that the mixed powder composing the p-side first metal layer 22 contains the iron powder in a large amount as compared to the titanium powder. In this case, it is possible to suppress peeling or the like at the interface between the p-type thermoelectric conversion layer 21 and the p-side first metal layer 22 even better because the coefficient of linear expansion of the p-side first metal layer 22 becomes closer to the coefficient of linear expansion of the p-type thermoelectric conversion layer 21.

A particle diameter of the titanium powder used as a material of the p-side second metal layer 23 and the p-side first metal layer 22 is preferably in a range of not less than 10 μm and not more than 50 μm.

It should be noted that the particle diameter of the powder used in the exemplary embodiment is able to be measured by a method, such as a laser diffraction scattering method. Here, a "particle diameter" of powder in this specification refers to a number average diameter in particle size distribution of the powder obtained by the laser diffraction scattering method.

In a case where the particle diameter of the titanium powder used in manufacturing the p-side first metal layer 22 and the p-side second metal layer 23 is excessively large, the p-side second metal layer 23 and the p-side first metal layer 22 to be formed tend to become porous layers. In this case, there is a possibility that strength of the p-side second metal layer 23 and the p-side first metal layer 22 is degraded. Moreover, in a case where the particle diameter of the titanium powder is excessively large, the adhesive properties between the p-side second metal layer 23 and the p-side first metal layer 22 or the adhesive properties between the p-side first metal layer 22 and the p-type thermoelectric conversion layer 21 tend to be reduced.

Further, in a case where the particle diameter of the titanium powder is excessively small, workability in the manufacturing step of the p-type thermoelectric element 2 tends to be degraded because such a material is difficult to work with.

The particle diameter of the iron powder, which is a material of the p-side first metal layer 22, is not particularly limited, but the particle diameter can be set, for example, in a range of not less than 20 μm and not more than 150 μm.

In the exemplary embodiment, it is preferable that the particle diameter of the iron powder composing the p-side first metal layer 22 is large as compared to the particle diameter of the titanium powder composing the p-side first metal layer 22. By setting the particle diameter of the iron powder large, in the case where the materials are charged into the die, the titanium powder tends to exist around the iron powder. Consequently, in the p-side first metal layer 22 to be formed, the iron simple substances and the titanium simple substances tend to exist in the form of lumps. As a result, the p-side first metal layer 22 in which the iron simple substances and the titanium simple substances exist in spots can be obtained.

Here, as described above, the filled-skutterudite-type alloy constituting the p-type thermoelectric conversion layer 21 contains iron, and thereby, the alloy has excellent adhesive properties with iron because the alloy contains the crystal structure of the body-centered cubic type, which is similar to iron. Accordingly, even in the case where the particle diameter of the iron powder composing the p-side first metal layer 22 is large as compared to the particle diameter of the titanium powder, the adhesive properties between the p-side first metal layer 22 and the p-type thermoelectric conversion layer 21 are hardly degraded.

It should be noted that, in a case where both of the particle diameter of the iron powder and the particle diameter of the titanium powder that compose the p-side first metal layer 22 are excessively small, iron and titanium react with each other by plasma sintering, to thereby tend to form an alloy. In this case, in the p-side first metal layer 22 to be formed, the existing amount of the iron simple substances and the titanium simple substances is reduced, and thereby, there is a possibility that the above-described effect of stress reduction or suppressing diffusion of antimony by the p-side first metal layer 22 becomes insufficient.

Moreover, a particle diameter of alloy powder used as a material of the p-type thermoelectric conversion layer 21 is preferably set in a range of not less than 10 μm and not more than 200 μm.

In a case where the particle diameter of the alloy powder used as the material of the p-type thermoelectric conversion layer 21 is excessively small, an oxidation reaction tends to occur in sintering or the like, and accordingly, there is a possibility that it becomes impossible to obtain desired properties of the p-type thermoelectric conversion layer 21.

On the other hand, in a case where the particle diameter of the alloy powder used as the material of the p-type thermoelectric conversion layer 21 is excessively large, the p-type thermoelectric conversion layer 21 tends to be coarse and porous. As a result of this, mechanical strength of the p-type thermoelectric conversion layer 21 is degraded and the p-type thermoelectric conversion layer 21 is easily broken when the thermoelectric module 1 is used.

It should be noted that the alloy powder used as the material of the p-type thermoelectric conversion layer 21 is able to be prepared by, for example, casting as follows.

First, each of RE (at least one kind selected from rare earth elements), iron, M (at least one kind selected from a group constituted by Co and Ni) and antimony that are used as the materials of the alloy powder constituting the p-side thermoelectric conversion layer 21 is weighed, and all of them are mixed. Here, in the mixing ratio of each material, with consideration given to a loss in later steps, it is preferable that antimony is formulated excessively compared to a stoichiometric composition ratio of the p-type thermoelectric conversion layer 21 that is to be finally obtained.

This is because antimony tends to be diffused, and in a case where there is a shortage of antimony in the p-type thermoelectric conversion layer 21, a trouble, such as degradation of thermoelectric conversion efficiency in the p-type thermoelectric conversion layer 21, tends to occur.

Subsequently, each weighed material is put into a crucible made of alumina or the like, and heated to be melted. It should be noted that the melting temperature can be set, for example, on the order of 1450° C. Next, the molten materials are rapidly cooled by use of strip casting and subjected to alloying. In strip casting, the molten materials are cooled at a cooling rate of 500° C./sec to 5000° C./sec in an atmosphere of argon, to thereby obtain rapidly cooled and solidified alloy with a thickness of the order of 0.1 mm to 0.5 mm. Then, by crushing the obtained rapidly cooled and solidified alloy, the alloy powder containing RE (at least one kind selected from rare earth elements), iron, M (at least one kind selected from a group constituted by Co and Ni) and antimony that are used as the materials of the p-side thermoelectric conversion layer 21 can be obtained.

It should be noted that the method of preparing the powder used as the materials of the p-type thermoelectric conversion layer 21 is not limited to the above-described method, and the powder may be prepared by, for example, an atomization method. Moreover, mixed powder obtained by mixing the powder of weighed RE (at least one kind selected from rare earth elements), iron, M (at least one kind selected from a group constituted by Co and Ni) and antimony and then sintered and crushed may be used as the materials of the p-side thermoelectric conversion layer 21.

(Method of Manufacturing Thermoelectric Module)

Subsequently, a description will be given of a specific example of a method of manufacturing the thermoelectric module 1 shown in FIG. 1 by use of the p-type thermoelectric element 2 and the n-type thermoelectric element 3 prepared by the above-described method.

To prepare the thermoelectric module 1, first, plural electrodes 4 composed of copper or the like are arranged and attached on an insulating substrate 7 constructed from, for example, a ceramic.

Next, the plural p-type thermoelectric elements 2 and the plural n-type thermoelectric elements 3 are connected to the respective electrodes 4 attached onto the substrate 7 so that the p-type thermoelectric elements 2 and the n-type thermoelectric elements 3 are serially connected in turn. On this occasion, the plural p-type thermoelectric elements 2 and the plural n-type thermoelectric elements 3 are configured to be sandwiched by two substrates 7, on each of which the plural electrodes 4 are attached.

In each of the p-type thermoelectric elements 2, the p-side second metal layer 23 is connected to the electrode 4, and in each of the n-type thermoelectric elements 3, the n-side second metal layer 33 is connected to the electrode 4. In addition, the p-type thermoelectric elements 2 and the n-type thermoelectric elements 3 are connected to the electrodes 4 via a metal paste, such as a silver paste.

Subsequently, by applying heat and pressure in the state where the plural p-type thermoelectric elements 2 and the plural n-type thermoelectric elements 3 both connected to the electrodes 4 are sandwiched by the two substrates 7, each of the p-type thermoelectric elements 2 and the n-type thermoelectric elements 3 is joined to the electrodes 4, and accordingly, the thermoelectric module 1 shown in FIG. 1 can be obtained.

In a case where the prepared thermoelectric module 1 is used for electric power generation, one of the substrates 7 is arranged as the high-temperature side and the other one of the substrates 7 is arranged as the low-temperature side, as described above. Then, heat is applied to the thermoelectric module 1 through the high-temperature-side substrate 7 and heat is removed through the low-temperature-side substrate 7, and thereby a temperature difference is generated between the p-type thermoelectric element 2 and the n-type thermoelectric element 3 in each thermoelectric module 1, to thereby cause the electromotive force. An electric resistance load is imposed to the two lead wires 6 connected to the electrodes 4 to take out a current.

Here, in many cases, the thermoelectric module 1 using the thermoelectric elements (the p-type thermoelectric element 2 and the n-type thermoelectric element 3) including the thermoelectric conversion layer made of the filled-skutterudite-type alloy containing antimony (the p-type thermoelectric conversion layer 21 and the n-type thermoelectric conversion layer 31) as the exemplary embodiment is used so that the temperature of the high-temperature side is about 500° C. to about 600° C., and the temperature of the low-temperature side is about 50° C. to about 100° C. In this case, in each of the thermoelectric elements (the p-type thermoelectric element 2 and the n-type thermoelectric element 3), the temperature difference between the high-temperature side and the low temperature side becomes on the order of 500° C.

Then, in each of the thermoelectric elements (the p-type thermoelectric element 2 and the n-type thermoelectric element 3), thermal expansion occurs in a portion located at the high-temperature side.

As described above, the crystal structure or the coefficient of linear expansion is greatly different between the filled-skutterudite-type alloy containing antimony that constitutes the p-type thermoelectric conversion layer 21 and titanium that constitutes the p-side second metal layer 23. For this reason, in a case where the p-side second metal layer 23 is provided directly on the p-type thermoelectric conversion layer 21 in the p-type thermoelectric element 2, the p-type thermoelectric element 2 becomes high temperature and each of the p-type thermoelectric conversion layer 21 and the p-side second metal layer 23 has thermal expansion, and accordingly, a stress occurs at the interface between the p-type thermoelectric conversion layer 21 and the p-side second metal layer 23. As a result, rupture, cracking or the like occurs at the interface between the p-type thermoelectric conversion layer 21 and the p-side second metal layer 23, and thereby the p-type thermoelectric element 2 is broken in some cases.

In contrast, in the p-type thermoelectric element 2 of the exemplary embodiment, the p-side first metal layer 22 containing iron and titanium in the state of simple substances is provided between the p-type thermoelectric conversion layer 21 and the p-side second metal layer 23. The coefficient of linear expansion of the p-side first metal layer 22 is a value existing somewhere between the coefficient of linear expansion of the p-type thermoelectric conversion layer 21 and the coefficient of linear expansion of the p-side second metal layer 23. Accordingly, in the exemplary embodiment, as compared to a case where the present configuration is not employed, differences in the coefficient of linear expansion between respective layers constituting the p-type thermoelectric element 2 (between the p-type thermoelectric conversion layer 21 and the p-side first metal layer 22, between the p-side first metal layer 22 and the p-side second metal layer 23).

As a result of this, in the p-type thermoelectric element 2 of the exemplary embodiment, even in a case where the p-type thermoelectric element 2 becomes high temperature in using the thermoelectric module 1, it is possible to reduce the difference in the thermal expansion amount between the p-type thermoelectric conversion layer 21 and the p-side first metal layer 22 and the difference in the thermal expansion amount between the p-side first metal layer 22 and the p-side second metal layer 23, as compared to a case where the present configuration is not employed.

Then, it is possible to suppress occurrence of a stress at the interface between the p-type thermoelectric conversion layer 21 and the p-side first metal layer 22, and at the interface between the p-side first metal layer 22 and the p-side second metal layer 23. Accordingly, in the p-type thermoelectric element 2, it is possible to suppress occurrence of rupture or cracking at the interface between the p-type thermoelectric conversion layer 21 and the p-side first metal layer 22, and at the interface between the p-side first metal layer 22 and the p-side second metal layer 23.

It should be noted that, as described above, at the portion of the p-type thermoelectric element 2 located on the low-temperature side of the thermoelectric module 1, the thermal expansion amount is small as compared to the high-temperature side. Consequently, as shown in FIG. 2B, the p-side first metal layer 22 is provided at least one of two facing surfaces of the p-type thermoelectric element 2, and the p-type thermoelectric element 2 may be used so that the p-side first metal layer 22 is located on the high-temperature side.

However, in consideration of the effect of suppressing diffusion of antimony from the p-type thermoelectric conversion layer 21 by the p-side first metal layer 22 as described above, and the possibility of using the thermoelectric module 1 with the high-temperature side and the low-temperature side being improperly oriented, it is preferable that the p-side first metal layers 22 are provided on both of the two facing surfaces of the p-type thermoelectric element 2 as shown in FIG. 2A.

Here, the filled-skutterudite-type alloy containing antimony that constitutes the p-type thermoelectric conversion layer 21 has a property of easily diffusing antimony. In particular, in the case where the p-type thermoelectric element 2 is used at high temperature as in the exemplary embodiment, the p-type thermoelectric conversion layer 21 has a tendency to diffuse antimony even more.

Then, in the case where antimony is diffused from the p-type thermoelectric conversion layer 21 to the electrodes 4 and the like, the crystal structure (filled-skutterudite structure) of the alloy constituting the p-type thermoelectric conversion layer 21 tends to be collapsed. In this case, the thermoelectric conversion efficiency in the p-type thermoelectric conversion layer 21 is likely to be degraded.

In contrast, in the p-type thermoelectric element 2 of the exemplary embodiment, the p-side first metal layer 22 containing iron and titanium in the state of simple substances and the p-side second metal layer 23 made of titanium are provided as described above, and therefore, diffusion of antimony from the p-type thermoelectric conversion layer 21 is suppressed, as compared to a case in which the present configuration is not employed.

This makes it possible to suppress degradation of thermoelectric conversion efficiency in the p-type thermoelectric conversion layer 21 in the p-type thermoelectric element 2. Further, it is possible to suppress property degradation of the electrodes 4 due to diffusion of antimony from the p-type thermoelectric conversion layer 21 to the electrodes 4.

Then, in the thermoelectric module 1 of the exemplary embodiment, since rupture or cracking of each layer in p-type thermoelectric element 2 is suppressed and diffusion of antimony from the p-type thermoelectric conversion layer 21 is suppressed, it becomes possible to suppress degradation in the output of electric power generation and increase of the electric resistance, to thereby improve durability of the thermoelectric module 1 even in a case where, for example, the thermoelectric module 1 is used under environments of large temperature difference between the high-temperature side and the low-temperature side for a long period of time.

EXAMPLE

Subsequently, the present invention will be described specifically based on Example. It should be noted that the present invention is not limited to Example as follows.

Example

(1) Preparation of p-Type Thermoelectric Element 2

Into a die made of graphite with a diameter of 3 cm, material powder of the p-side second metal layer 23, which was composed of titanium powder and has an average particle diameter of 15 μm, material powder of the p-side first metal layer 22 containing titanium powder with an average particle diameter of 15 μm and iron powder with an average particle diameter of 100 μm at a ratio (weight ratio) of 16 to 84 (Ti:Fe=16:84), material powder of the p-type thermoelectric conversion layer 21 with an average particle diameter of 100 μm containing praseodymium, neodymium, iron, nickel and antimony at a ratio (atomic percent) of 1.2%, 3.4%, 20.3%, 3.6% and 71.5%, respectively, the above-described material powder of the p-side first metal layer 22, and the above-described material powder of the p-side second metal layer 23 were put in this order.

Subsequently, discharge plasma sintering was conducted under the conditions of the sintering temperature of 600° C. and the sintering pressure of 60 MPa, and thereby the p-type thermoelectric element 2, in which the p-side first metal layer 22 that was made of a sintered body of iron and titanium and contained iron and titanium in the state of simple substances and the p-side second metal layer 23 made of a sintered body of titanium were laminated on each of both upper and lower end surfaces of the p-type thermoelectric conversion layer 21 made of the filled-skutterudite-type alloy containing antimony, was prepared.

It should be noted that the thickness of the p-side first metal layer 22 was about 200 μm, and the thickness of the p-side second metal layer 23 was about 100 μm.

Figure 4:
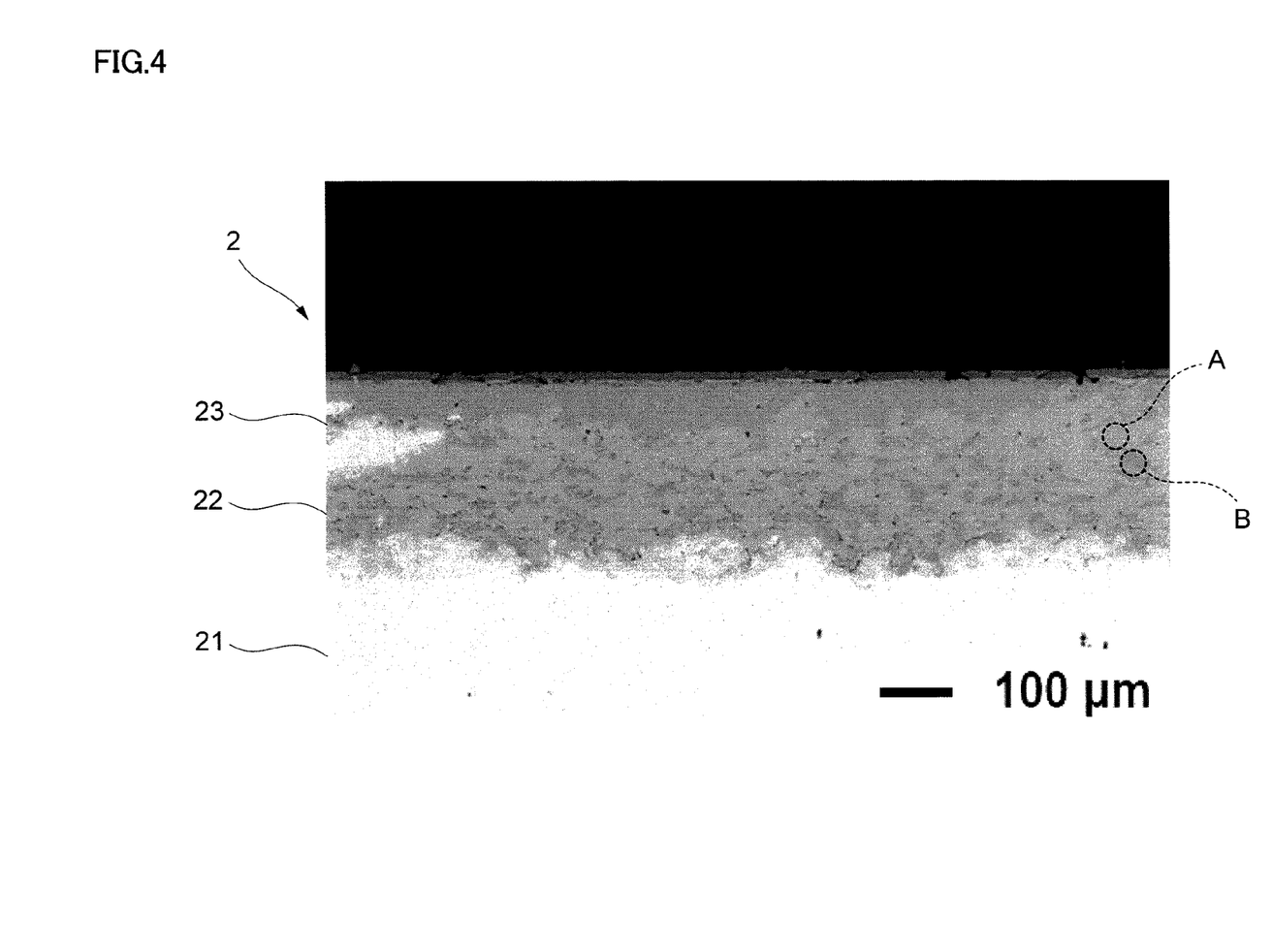
FIG. 4 shows an enlarged view of a p-type thermoelectric element obtained by an example.

An enlarged view of the obtained p-type thermoelectric element 2 is shown in FIG. 4.

As shown in FIG. 4, in this Example, the p-type thermoelectric element 2, in which the p-side first metal layer 22 and the p-side second metal layer 23 were laminated in order on the p-type thermoelectric conversion layer 21, was able to be obtained. Then, it was verified that, in the p-side first metal layer 22, iron simple substances (portion indicated as A in FIG. 4) and titanium simple substances (portion indicated as B in FIG. 4) were formed in spots.

In addition, in the obtained p-type thermoelectric element 2, it was verified that cracking or peeling did not occur at the interface between the p-type thermoelectric conversion layer 21 and the p-side first metal layer 22 and at the interface between the p-side first metal layer 22 and the p-side second metal layer 23.

(2) Preparation of n-Type Thermoelectric Element 3

Into a die made of graphite with a diameter of 3 cm, material powder of the n-side second metal layer 33, which was composed of titanium powder and has an average particle diameter of 15 μm, material powder of the n-side first metal layer 32 containing titanium powder with an average particle diameter of 44 μm and aluminum powder with an average particle diameter of 5 μm, material powder of the n-type thermoelectric conversion layer 31 with an average particle diameter of 100 μm containing ytterbium, iron, cobalt and antimony at a ratio (atomic percent) of 1.8%, 1.4%, 23.2% and 73.6%, respectively, the above-described material powder of the n-side first metal layer 32, and the above-described material powder of the n-side second metal layer 33 were put in this order.

Subsequently, discharge plasma sintering was conducted under the conditions of the sintering temperature of 700° C. and the sintering pressure of 60 MPa, and thereby the n-type thermoelectric element 3, in which the n-side first metal layer 32 that was made of a sintered body of aluminum and titanium and contained aluminum and titanium in the state of simple substances and the n-side second metal layer 33 made of a sintered body of titanium were laminated on each of both upper and lower end surfaces of the n-type thermoelectric conversion layer 31 made of the filled-skutterudite-type alloy containing antimony, was prepared.

It should be noted that the thickness of the n-side first metal layer 32 was about 200 μm, and the thickness of the n-side second metal layer 33 was about 100 μm.

(3) Preparation of Thermoelectric Module 1

Each of the obtained p-type thermoelectric element 2 and n-type thermoelectric element 3 were cut to a size of 3.7 mm wide by 3.7 mm long by 4.0 mm thick. Thereafter, 18 pairs of p-type thermoelectric element 2 and n-type thermoelectric element 3 that have been cut were joined through the electrodes 4 having a thickness of 0.5 mm, to thereby prepare the thermoelectric module 1 with a size of 30 mm wide by 30 mm long by 5 mm thick.

Comparative Example

The p-type thermoelectric element 2 was prepared in a way similar to the above-described Example except that the p-side first metal layer 22 was not provided. Then, the n-type thermoelectric element 3 was prepared similar to Example, and the thermoelectric module 1 was prepared in a way similar to Example by use of the p-type thermoelectric element 2 and the n-type thermoelectric element 3 that have been prepared.

Evaluation Test

A thermal cycle test was conducted with respect to the thermoelectric modules 1 prepared by Example and Comparative Example. Specifically, a thermal cycle, in which a room temperature was heated by a heater and increased up to 500° C. in an hour and the temperature of 500° C. was decreased to the room temperature in an hour, was applied to the high-temperature side of the thermoelectric module 1. On the other hand, the low-temperature side of the thermoelectric module 1 was water cooled, to thereby generate the temperature difference between the high-temperature side and the low-temperature side of the thermoelectric module 1.

Figure 5:
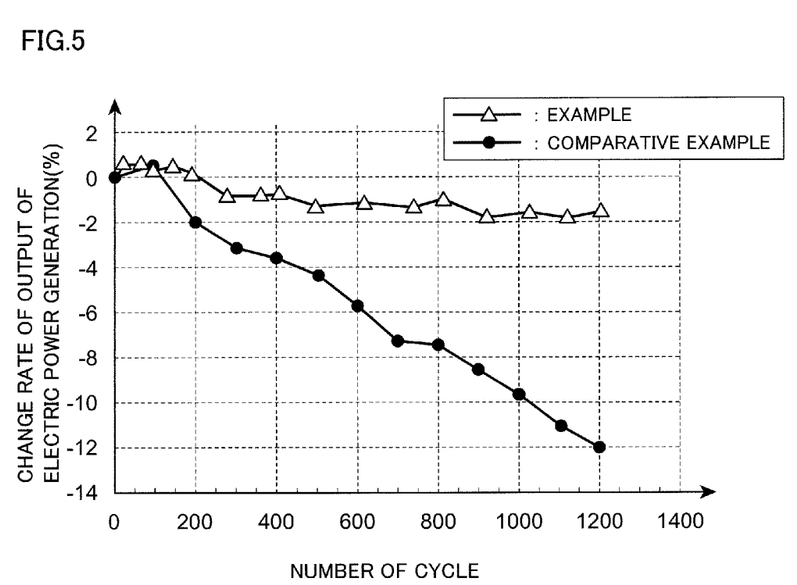
FIG. 5 is a diagram showing a change rate of the output of electric power generation in each cycle when a temperature difference between a high-temperature side and a low-temperature side of the thermoelectric module becomes maximum.

FIG. 5 is a diagram showing a change rate of the output of electric power generation in each cycle when the temperature difference between the high-temperature side and the low-temperature side of the thermoelectric module 1 becomes maximum. As shown in FIG. 5, the output after 1200 cycles was reduced about 12% in the thermoelectric module 1 in Comparative Example; however, in contrast thereto, the output was reduced merely about 1.5% in the thermoelectric module 1 in Example.

Figure 6:
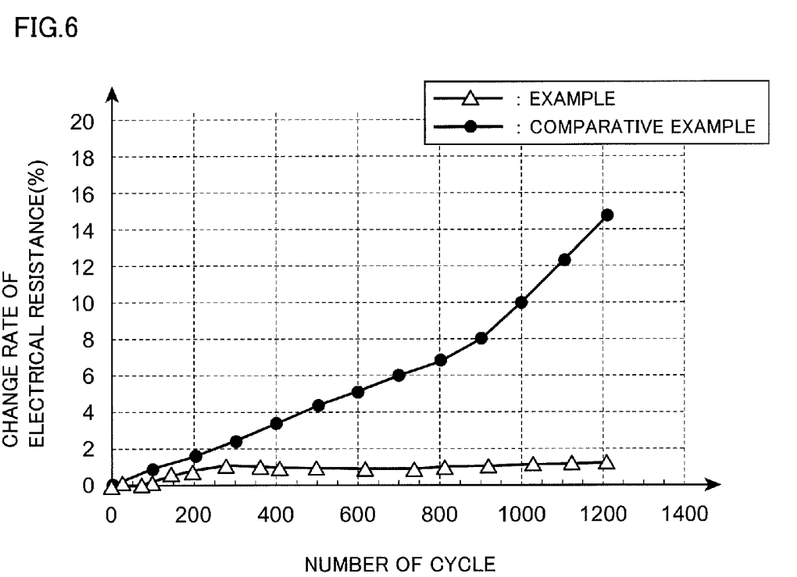
FIG. 6 is a diagram showing a change rate of electrical resistance in each cycle when the temperature difference between the high-temperature side and the low-temperature side of the thermoelectric module becomes maximum.

Moreover, FIG. 6 is a diagram showing a change rate of electrical resistance in each cycle when the temperature difference between the high-temperature side and the low-temperature side of the thermoelectric module 1 becomes maximum. As shown in FIG. 6, the electrical resistance after 1200 cycles increased about 15% in the thermoelectric module 1 in Comparative Example; however, in contrast thereto, the electrical resistance increased merely about 1.3% in the thermoelectric module 1 in Example.

As described above, it was verified that degradation by thermal cycles was suppressed and initial performance was able to be maintained for a long time in the thermoelectric module 1 in Example.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A thermoelectric element comprising:
   a thermoelectric conversion layer made of an alloy having a filled-skutterudite structure containing antimony;
   a first metal layer that contains pure titanium metal portions and pure iron metal portions in admixture, and is laminated on the thermoelectric conversion layer; and
   a second metal layer that is composed of titanium, and is laminated on the first metal layer.

2. The thermoelectric element according to claim 1, wherein a content by weight of the pure iron metal portions in the first metal layer is greater than a content by weight of the pure titanium metal portions in the first metal layer.

3. The thermoelectric element according to claim 2, wherein a content ratio between titanium and iron in the first metal layer is in a range from 10:90 to 40:60, where the content ratio is a weight ratio.

4. The thermoelectric element according to claim 1, wherein the thermoelectric conversion layer is made of an alloy having a filled-skutterudite structure represented as $RE_x(Fe_{1-y}M_y)_4Sb_{12}$, where RE is at least one kind selected from rare earth elements, M is at least one kind selected from a group constituted by Co and Ni, $0.01 \leq x \leq 1$, and $0 \leq y \leq 0.3$.

5. The thermoelectric element according to claim 2, wherein the thermoelectric conversion layer is made of an alloy having a filled-skutterudite structure represented as $RE_x(Fe_{1-y}M_y)_4Sb_{12}$, where RE is at least one kind selected from rare earth elements, M is at least one kind selected from a group constituted by Co and Ni, $0.01 \leq x \leq 1$, and $0 \leq y \leq 0.3$.

6. The thermoelectric element according to claim 3, wherein the thermoelectric conversion layer is made of an alloy having a filled-skutterudite structure represented as $RE_x(Fe_{1-y}M_y)_4Sb_{12}$, where RE is at least one kind selected from rare earth elements, M is at least one kind selected from a group constituted by Co and Ni, $0.01 \leq x \leq 1$, and $0 \leq y \leq 0.3$.

7. The thermoelectric element according to claim 1, wherein a coefficient of linear expansion of the first metal layer is a value existing between a coefficient of linear expansion of the thermoelectric conversion layer and a coefficient of linear expansion of the second metal layer.

8. The thermoelectric element according to claim 2, wherein a coefficient of linear expansion of the first metal layer is a value existing between a coefficient of linear expansion of the thermoelectric conversion layer and a coefficient of linear expansion of the second metal layer.

9. The thermoelectric element according to claim 3, wherein a coefficient of linear expansion of the first metal layer is a value existing between a coefficient of linear expansion of the thermoelectric conversion layer and a coefficient of linear expansion of the second metal layer.

10. The thermoelectric element according to claim 4, wherein a coefficient of linear expansion of the first metal layer is a value existing between a coefficient of linear expansion of the thermoelectric conversion layer and a coefficient of linear expansion of the second metal layer.

11. The thermoelectric element according to claim 5, wherein a coefficient of linear expansion of the first metal layer is a value existing between a coefficient of linear expansion of the thermoelectric conversion layer and a coefficient of linear expansion of the second metal layer.

12. The thermoelectric element according to claim 6, wherein a coefficient of linear expansion of the first metal layer is a value existing between a coefficient of linear expansion of the thermoelectric conversion layer and a coefficient of linear expansion of the second metal layer.

13. A thermoelectric module comprising:
   a thermoelectric element; and
   an electrode electrically connected thereto,
   wherein the thermoelectric element comprises:
   a thermoelectric conversion layer made of an alloy having a filled-skutterudite structure containing antimony;
   a first metal layer that contains pure titanium metal portions and pure iron metal portions in admixture, and is laminated on the thermoelectric conversion layer between the electrode and the thermoelectric conversion layer; and
   a second metal layer that is composed of titanium, and is laminated between the first metal layer and the electrode.

14. A method of manufacturing the thermoelectric element as claimed in claim 1, comprising:
   laminating titanium powder, mixed powder containing titanium powder and iron powder, alloy powder containing antimony, iron and a rare earth element, the mixed powder containing titanium powder and iron powder, and the titanium powder in order in a die; and performing plasma sintering on the powders laminated in the die while applying pressure in a laminating direction of the powders.

15. The method of manufacturing a thermoelectric element according to claim 14, wherein a particle diameter of the titanium powder is in a range of not less than 10 μm and not more than 50 μm.

16. The method of manufacturing a thermoelectric element according to claim 14, wherein the mixed powder contains the iron powder in a greater amount by weight as compared to the titanium powder.

17. The method of manufacturing a thermoelectric element according to claim 15, wherein the mixed powder contains the iron powder in a greater amount by weight as compared to the titanium powder.

18. The thermoelectric element according to claim 1, wherein the first metal layer is prepared by sintering a mixed powder of titanium powder and iron powder.

19. The thermoelectric module according to claim 13, wherein the first metal layer is prepared by sintering a mixed powder of titanium powder and iron powder.

* * * * *